(12) United States Patent
Schroiff

(10) Patent No.: US 8,741,765 B2
(45) Date of Patent: Jun. 3, 2014

(54) CONTROLLED ELECTROPLATED SOLDER BUMPS

(75) Inventor: Christian Schroiff, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 281 days.

(21) Appl. No.: 13/076,881

(22) Filed: Mar. 31, 2011

(65) Prior Publication Data

US 2012/0252203 A1 Oct. 4, 2012

(51) Int. Cl.
*H01L 21/44* (2006.01)

(52) U.S. Cl.
USPC ............. 438/613; 257/E21.476; 257/E21.509

(58) Field of Classification Search
USPC ........... 438/613, 612; 257/E21.476, E21.508, 257/E21.509
See application file for complete search history.

(56) References Cited

U.S. PATENT DOCUMENTS

| | | | | |
|---|---|---|---|---|
| 6,669,834 | B2 * | 12/2003 | Batz et al. | 205/122 |
| 2004/0253804 | A1 * | 12/2004 | Beica et al. | 438/614 |
| 2005/0095854 | A1 * | 5/2005 | Uzoh et al. | 438/678 |
| 2009/0140439 | A1 * | 6/2009 | Ju et al. | 257/776 |

* cited by examiner

Primary Examiner — Calvin Choi
(74) Attorney, Agent, or Firm — Ditthavong Mori & Steiner, P.C.

(57) ABSTRACT

The uniformity of the composition of plated solder bumps from one batch of wafers to another is improved by controlling the rotational speed of the wafers based on the particular solder bump pattern. Embodiments include sequentially horizontal fountain electroplating a pattern of solder bumps, e.g., SnAg solder bumps, on a plurality batches of wafers and controlling the rotational speed of each batch of wafers during electroplating based on a calibration plot of the concentration of a solder bump component, e.g., Ag, as a function of rotational speed for each solder bump pattern, such that the uniformity of the Ag concentration in the patterns of solder bumps is greater than 95%, e.g., greater than 98%. Embodiments further include electroplating in the same plater sequential batches of wafers having both different patterns and different solder bump compositions at the same high throughput.

18 Claims, 3 Drawing Sheets

CONTROLLED ELECTROPLATED SOLDER BUMPS

TECHNICAL FIELD

The present disclosure relates to semiconductor packaging with improved throughput, high yield, and reduced manufacturing time. The present disclosure is particularly applicable to wafer bumping by horizontal fountain electroplating.

BACKGROUND

Semiconductor packaging typically involves forming a bump on a substrate, e.g., a solder bump on a wafer. Such bumps can be formed by various techniques such as electroplating, vapor deposition, printing, and ball-bumping. The continuous increase in I/O terminals on semiconductor chips and small pitches of interconnections have led to wider use of electroplating, which can provide fine structure metallization and higher yields. Electroplating processes can be generally categorized in two types. In a fountain or cup type process, a substrate, such as a semiconductor wafer, is plated while the surface to be plated faces downward into a plating solution supplied upwardly to metalize the surface. In a dip type process, the substrate is vertically placed in a plating vessel and the solution is supplied from the bottom to overflow the top of the plating vessel.

Plating tools must be capable maintaining high throughput and bump uniformity. Performance of a plating tool is very dependent on the consistency and control of the solution flow to the wafer. The composition of a solder bump depends on the plating bath composition, plating rate, and plating area. Various semiconductor wafers are designed for different industrial applications, such as microprocessors, smart phones, mobile phones, cellular handsets, set-top boxes, DVD recorders and players, automotive navigation, printers and peripherals, networking and telecom equipment, gaming systems, and digital cameras. Consequently, various wafers are designed to be plated with different solder bump patterns. Solder bump patterns may differ in the array or arrangement, number, pitch and/or size, e.g., diameter, of the solder bumps. It is difficult, however, to maintain solder bumps at a uniform concentration, particularly at a uniform concentration from wafer-to-wafer, as where the wafers are electroplated with different solder bump patterns, in the same plating tool without sacrificing throughput. If the plating rate is adjusted to maintain a uniform solder bump composition, throughput is sacrificed, because a constant plating rate must be maintained to achieve a high throughput. It is also very difficult to electroplate different wafers with solder bumps having different predetermined or targeted compositions in the same plater without reducing throughput. The highly competitive marketplace requires high throughput for survival.

A need therefore exists for methodology enabling the electrodeposition of a pattern of solder bumps having a uniform composition. A particular need exists for methodology enabling the electrodeposition of different patterns of solder bumps on different wafers at a uniform solder bump composition, or at different predetermined compositions, at the same high throughput.

SUMMARY

An aspect of the present disclosure is a method of electroplating a pattern of solder bumps having a uniform composition.

Another aspect of the present disclosure is a method of electroplating different patterns of solders bumps on different wafers with a constant solder bump composition and high throughput.

A further aspect of the present disclosure is a method of electroplating different wafers with the same or different solder bump patterns having different predetermined solder bump compositions in the same plater at a constant high throughput.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

Aspects of the present disclosure include electroplating a pattern of solder bumps on a wafer by horizontal fountain electroplating, rotating the wafer during electroplating at a rotational speed, and controlling the rotational speed of the wafer during electroplating to regulate the concentration of the solder bumps in the pattern. Further aspects include controlling the rotational speed depending on the pattern of solder bumps. Other aspects include electroplating a first pattern of solder bumps on a first wafer in a horizontal fountain plater while rotating the first wafer at a first rotational speed, providing a second wafer to be plated with a second pattern of solder bumps, adjusting the first rotational speed to a second rotational speed determined by the second pattern of solder bumps, and electroplating the second pattern of solder bumps on the second wafer while rotating the second wafer at the second rotational speed. Additional aspects include electroplating different wafers having solder bump patterns that differ in arrangement, number, pitch, and/or diameter, and controlling the rotational speed of each wafer, as at 40 to 150 rpm, such that the solder bump composition from wafer-to-wafer does not vary by more than 5%, e.g., by not more than 2%.

Other aspects of the present disclosure include preparing a first calibration plot of the concentration of a solder component in a solder bump as a function of rotational speed for a wafer electroplated with a first pattern of solder bumps, providing a first wafer to be electroplated with the first pattern of solder bumps, determining a first rotational speed from the first calibration plot for a predetermined concentration of the solder component, and electroplating the first pattern of solder bumps on the first wafer in a horizontal fountain plater while rotating the first wafer at the first rotational speed, whereby the composition of the solder bumps is substantially constant. Further aspects include preparing a second calibration plot of the concentration of the solder component in a solder bump as a function of rotational speed for a wafer electroplated with a second pattern of solder bumps, providing a second wafer to be electroplated with the second pattern of solder bumps, determining a second rotational speed from the second calibration plot for the predetermined concentration of the solder component, electroplating the second pattern of solder bumps on the second wafer in the same horizontal fountain plater while rotating the second wafer at the second rotational speed. Further aspects include rotating the first and second wafers such that the composition of the solder bumps does not vary by more than 5% from first wafer to the second wafer. Aspects also include rotating the first and second wafers such that the solder bumps in the first pattern have a first predetermined composition and the solder bumps in the second pattern have a second predetermined composition different from the first predetermined composition. Aspects include electroplating the first and second wafers at substantially the same plating rate and at substantially the same throughput.

Another aspect of the present disclosure includes sequentially electroplating a first pattern of solder bumps on a first wafer and a second pattern of solder bumps on a second wafer in a horizontal fountain plater, the method comprising, rotating the first wafer at a first rotational speed determined by the first pattern, and rotating the second wafer at a second rotational speed, different from the first rotational speed, determined by the second pattern. Aspects include electroplating electroplating the first and second wafers with first and second patterns that differ in arrangement, number, pitch, and/or diameter.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
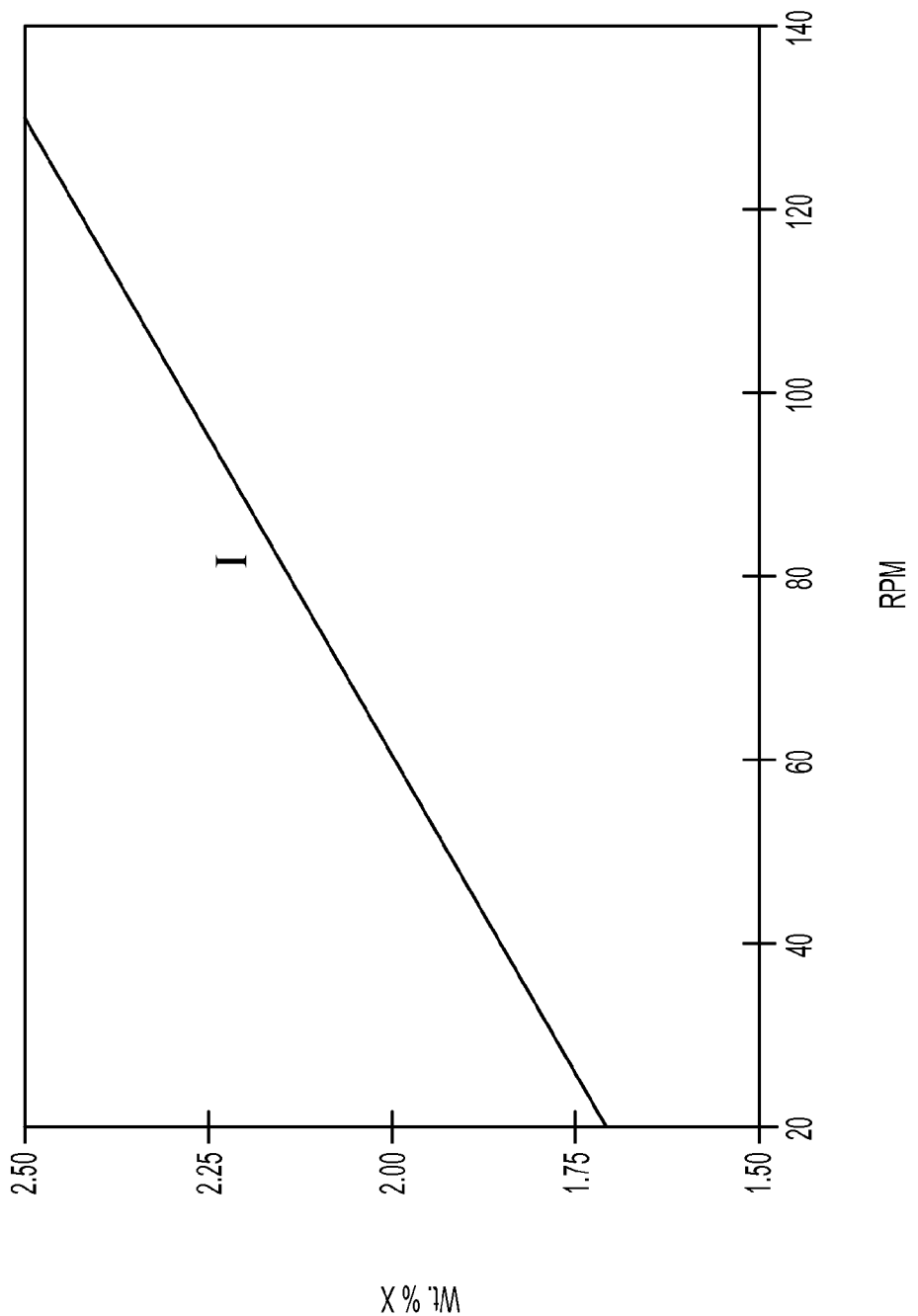
FIGS. 1A and 1B illustrate equilibrium plots for different solder bump patterns.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves, inter alia, the problem of electroplating wafers with solder bump patterns having a uniform composition at a high throughput while maintaining the same plating rate. In conventional practices it is necessary to alter the plating rate in order to achieve uniform solder bump composition. However, when the plating rate is changed, the throughput is reduced. Therefore a high constant throughput cannot be maintained and, hence, a competitive disadvantage results. The present disclosure also addresses the problem of electroplating wafers having either the same or different solder bump patterns in the same plater by targeting the solder bumps with a particular predetermined composition without altering the plating rate and yet achieve a high uniform maximized throughput. After experimentation and investigation it was found that the solder bump composition is dependent upon the rotational rate of the wafer for a particular solder bump pattern. Solder bump patterns may vary from wafer-to-wafer depending upon the ultimate utility. Such variance includes differences in arrangement, number, pitch, and/or diameter of the solder bumps. Typically, any such variance creates a variance in the areas to be plated among wafers. In accordance with embodiments of the present disclosure, the pattern of solder bumps is electroplated on a wafer in horizontal fountain plater, e.g., a conventional, commercially available plater, and rotating the wafer during electroplating at a predetermined rotational speed depending upon the particular wafer pattern and the desired solder composition. After plating a wafer, another wafer is positioned in the same plater using the same plating bath and employing the same plating rate. However, depending upon the particular solder bump pattern to be deposited on that wafer, a different rotational speed is selected to ensure that the solder bumps plated on the subsequent wafer are at the same composition as the previous wafer.

In accordance with embodiments of the present disclosure, strategic adjustment of the rotational speed enables plating at a stable plating rate for different solder bump patterns and bump geometries. Stable plating rates afford several advantages. Not only is throughput maximized, but the plated solder bumps advantageously exhibit stable physical properties, as the morphology of the deposit and the codeposition of impurities are influenced by the plating rate. In addition, the geometric uniformity of the solder bumps across the wafer is influenced by the plating rate.

Methodology in accordance with embodiments of the present disclosure includes processing sequential batches of wafers in the same plating bath using substantially the same plating rate while varying the rotational speed for each batch of wafers depending upon the particular solder bump pattern and particular composition desired. Typically, each batch of wafers belongs to a lot for a product, and the rotational speed for each product-specific recipe is stored on the plating tool. Embodiments also include electroplating batches of wafers having the same solder bump pattern but different solder bump compositions by selecting an appropriate rotational speed for each batch of wafers, each batch having a predetermined targeted solder bump composition.

In accordance with embodiments of the present disclosure, a calibration plot is prepared for a particular wafer pattern and a particular solder composition. The calibration plot represents the concentration of a component of the solder as a function of the rotational speed. A series of such calibration plots are prepared based upon various solder bump patterns. When electroplating in the plater a wafer having a particular solder bump pattern, the appropriate rotational speed can be selected from the calibration plot for the particular solder bump pattern depending upon the predetermined or desired solder bump component concentration. Therefore, embodiments of the present disclosure provide great flexibility in tailoring the particular composition of a solder bump regardless of the type of solder bump pattern on sequentially processed wafers in a plating bath having the same composition and plating rate without any sacrifice in throughput, i.e., a constant high throughput can be maintained thereby providing a distinct competitive advantage.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
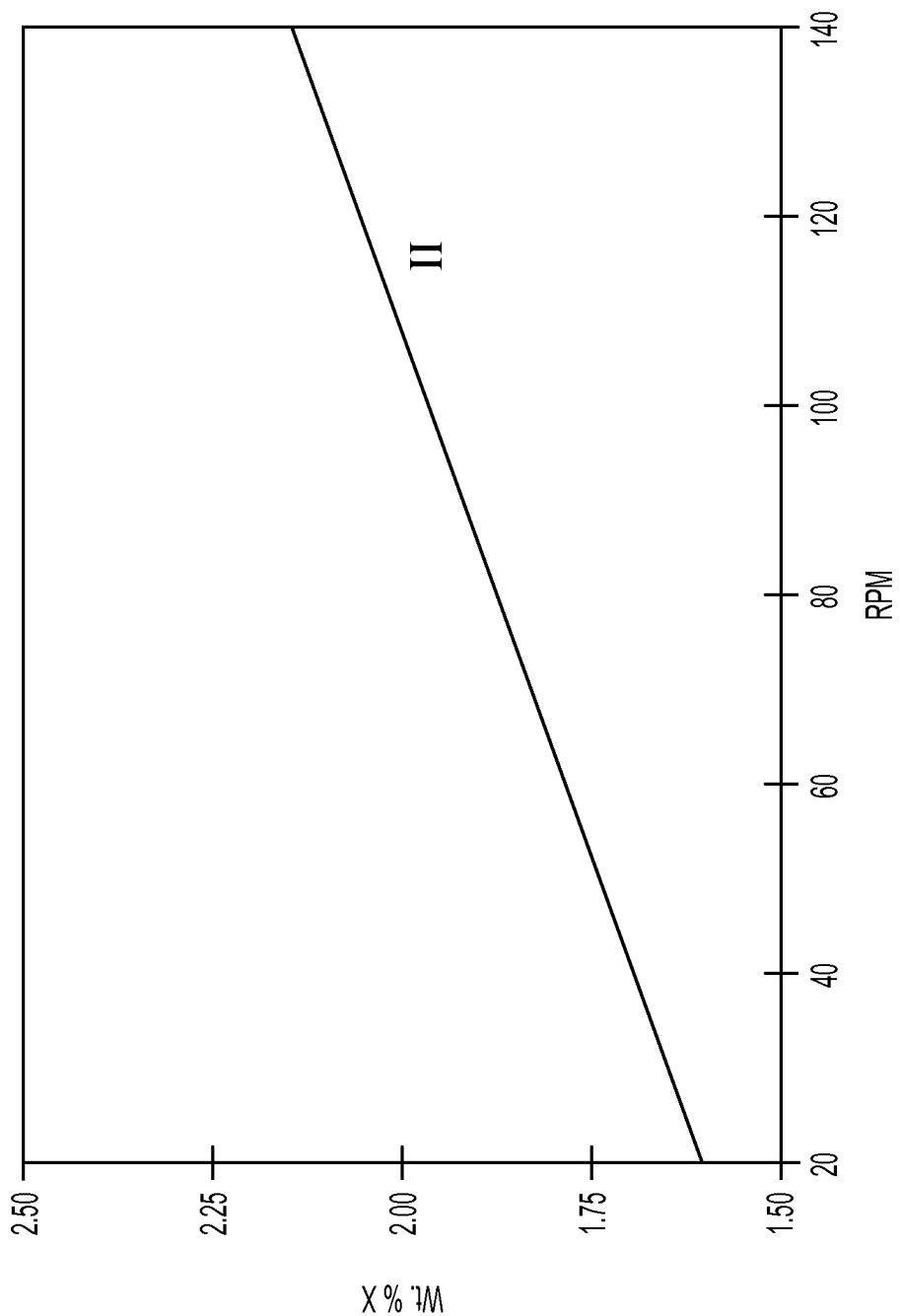

FIGS. 1A and 1B schematically illustrate equilibrium plots for use in embodiments of the present disclosure It is understood that in accordance with embodiments of the present disclosure, any number of equilibrium plots can be prepared for any number of solder bump patterns, any number of solders, and any combination thereof. Adverting to FIG. 1A, equilibrium plot I may be prepared for a particular solder bump pattern and a particular solder, e.g., a SnAg solder. In FIG. 1A, for illustrative purpose, the letter "X" represents Ag. FIG. 1B illustrates another equilibrium plot II for the same solder composition wherein X represents Ag. The equilibrium plot II is based upon a solder bump pattern different from that used to prepare equilibrium plot I.

Referring to FIGS. 1A and 1B, it can be readily appreciated that a particular solder bump composition can be controlled in a horizontal fountain plater using the same bath composition and plating rate while maintaining a high constant throughput, by strategically controlling the rotational speed of the wafer. For example, a first batch of wafers to be plated with a first solder bump pattern is lowered into a plater. The plating bath contains a solder, e.g., SnAg. The appropriate equilibrium plot is then selected, for example, equilibrium plot I illustrated in FIG. 1A, for that particular solder bump pattern. Targeting 2 wt. % of component X (Ag), the rotational speed is set at 60 rpm. After plating the first batch of wafers, a second batch of wafers to be plated with a different solder bump pattern is provided. The appropriate equilibrium plot is then selected for that particular solder bump pattern and the same solder, for example, equilibrium plot II illustrated in FIG. 1B. Targeting the same 2 wt. % Ag, a rotational speed is set at 100 rpm. The subsequent batch of wafers is then electroplated at a rotational speed of 100 rpm. It can be appreciated that any number of batches of wafers can be processed in this manner regardless of the solder bump pattern and any differences in arrangements, number, pitch, and/or diameter of solder bumps.

In other embodiments of the present disclosure, again adverting to FIGS. 1A and 1B, solder bumps having different Ag concentrations can be provided on a plurality of batches of wafers even though the batches of wafers have the same solder bump patterns. For example, adverting to FIG. 1A, a first batch of wafers is initially provided to be plated with a first solder bump pattern, having a corresponding calibration plot I. Targeting the first wafer at a Ag concentration of 2 wt. %, the first wafer is rotated at 60 rpm. A subsequent batch of wafers is provided to be electroplated with the same solder bump pattern as the first batch of wafers, however, the silver concentration is now targeted at 2.25 wt. %. The same calibration plot I is consulted and a rotational speed of 100 rpm is selected. The subsequent batch of wafers is then electroplated at a rotational speed of 100 rpm. It can be readily appreciated that a plurality of batches of wafers can be processed regardless of the solder bump pattern in a constant composition plating bath at a constant plating rate regardless of the targeted solder bump composition, whether it be the same or different, without any sacrifice in throughput.

Figure 2:
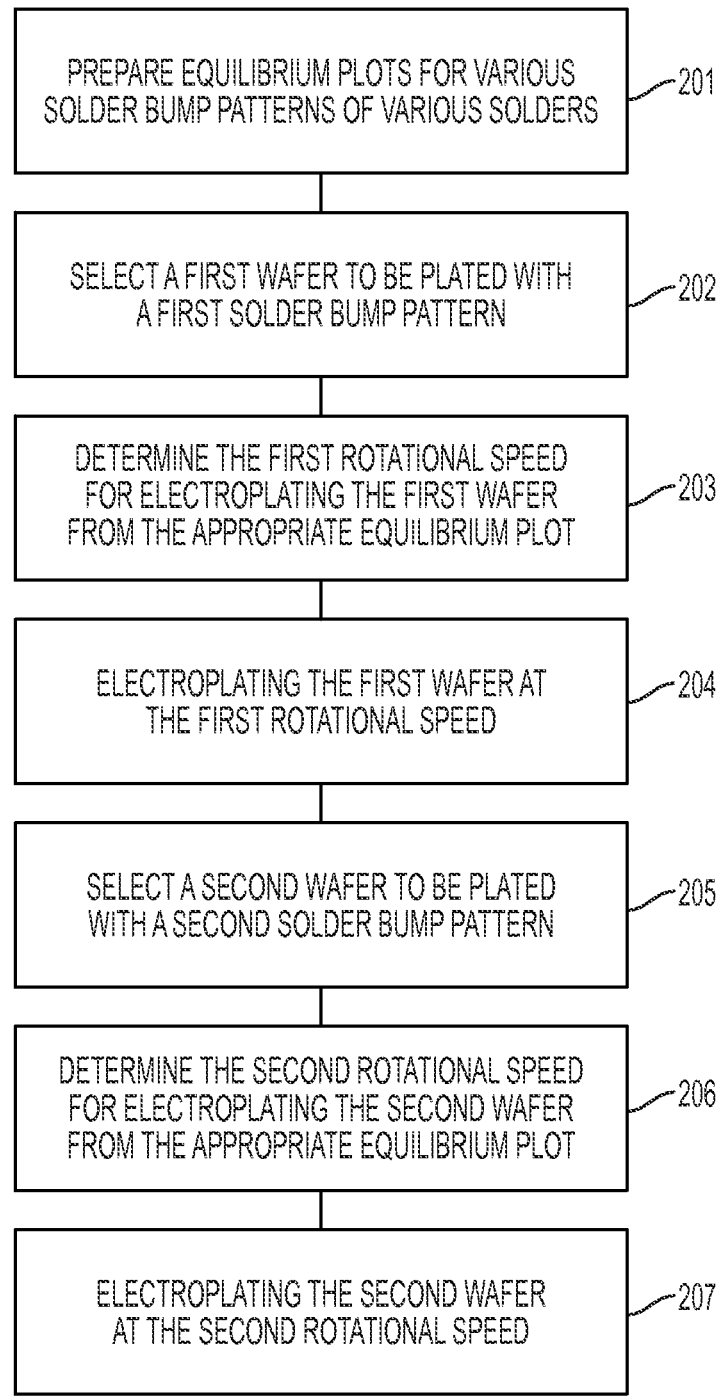
FIG. 2 schematically illustrates a flow chart of steps in accordance with some embodiments of the present disclosure

FIG. 2 schematically illustrates a process flow for electroplating a plurality of wafers in a horizontal fountain plater. Adverting to FIG. 2, step 201 may include preparing equilibrium plots of solder bump composition versus rotational speed, such as those illustrated in FIGS. 1A and 1B, for various solder bump patterns of a particular solder. Subsequently, at step 202, a first batch of wafers is selected to be electroplated with a first solder bump pattern at a particular concentration. The first rotational speed for wafer 1 is selected for the particular solder bump concentration by consulting the appropriate equilibrium plot for that solder bump pattern by determining the rotational speed that corresponds to the particular solder bump concentration (step 203). At step 204, the first wafer is electroplated at the first rotational speed. The flexibility of embodiments of the present disclosure can be appreciated by considering the various alternatives that can be implemented based upon steps 205, 206 and 207. For example, a second batch of wafers is selected to be electroplated with a second solder bump pattern (step 205). At step 206, the rotational speed is then selected from an appropriate equilibrium plot for that particular solder bump pattern depending on the desired solder bump concentration. The second solder bump pattern can be the same or different from the first solder bump pattern in any of various respects, i.e., arrangement, number, pitch, and/or diameter of the solder bumps. The composition of the solder bumps in the second solder bump pattern can be selected to be either the same as or different from the composition of the solder bumps in the first solder bump pattern on the first batch of wafers. If the second solder bump pattern is the same as the first solder bump pattern, but the composition of the solder bumps in the second solder bump pattern is targeted to be different from that of the first solder bump pattern, then the appropriate rotational speed may be selected from the same equilibrium plot. If the second solder bump pattern is different from the first solder bump pattern, and either the same or a different concentration is targeted for the solder bumps of the second solder bump pattern, the appropriate rotational speed can be determined from the equilibrium plot for the second solder bump pattern in step 206. Finally, in step 207, the second batch of wafers is electroplated at the second rotational speed. Embodiments of the present disclosure can achieve a uniform solder bump composition on sequentially electroplated batches of wafers, such as a uniform solder bump concentration from wafer-to-wafer of 95% or greater, e.g., 98% or greater. Embodiments of the present disclosure include processing any number of batches of wafers, for example, a third batch of wafers, a fourth batch of wafers, a fifth batch of wafers, and more, using the same plater, the same plating bath having the same solder composition and same plating rate, all without any sacrifice in throughput, thereby maximizing efficiency.

Embodiments of the present disclosure can be implemented in any of various types of horizontal fountain electroplating tools, which are commercially available from various sources, such as Raider ECD, available from Applied Materials, Semitool Business Unit, Kalispell, Mont.

In accordance with embodiments of the present disclosure, any of various types of solders can be electroplated at high throughput, including, but not limited to, SnAg, with more than 0.7 wt. % to 2.8 wt % Ag, and the balance essentially Sn. Other solders include SnCu (tin-copper) and SAC (tin-silver-copper).

The embodiments of the present disclosure can achieve several technical effects, particularly in electroplating various solder bump patterns at a high constant throughput on wafers for use in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a solder bump pattern on a batch of wafers by horizontal fountain electroplating, the solder bump pattern comprising a solder material;
   rotating the wafers during electroplating at a rotational speed; and
   controlling the rotational speed of the wafers during electroplating to regulate the concentration of the solder material.

2. The method according to claim 1, comprising controlling the rotational speed depending on the pattern of solder bumps.

3. The method according to claim 1, comprising:
   electroplating a first pattern of solder bumps on a first batch of wafers in a horizontal fountain plater while rotating the first batch of wafers at a first rotational speed;
   providing a second batch of wafers to be plated with a second pattern of solder bumps;
   adjusting the first rotational speed to a second rotational speed determined by the second pattern of solder bumps; and
   electroplating the second pattern of solder bumps on the second batch of wafers while rotating the second batch of wafers at the second rotational speed.

4. The method according to claim 3, comprising electroplating the first and second batches of wafers at substantially the same throughput and at substantially the same plating rate.

5. The method according to claim 4, wherein the solder comprises silver (Ag).

6. The method according to claim 5, wherein the solder also comprises tin (Sn).

7. The method according to claim 4, comprising controlling the first and second rotational speeds such that the composition of the solder bumps does not vary by more than 5.0% from the first batch of wafers to the second batch of wafers.

8. The method according to claim 6, comprising controlling the first and second rotational speeds such that the concentration of Ag in the solder bumps does not vary by more than 5.0% from the first batch of wafers to the second batch of wafers.

9. The method according to claim 6, comprising rotating the first and second batches of wafers at different rotational speeds between 40 and 150 rpm.

10. The method according to claim 8, comprising rotating the first and second batches of wafers at different rotational speeds between 40 and 150 rpm.

11. The method according to claim 3, wherein the first and second patterns are different in the arrangement, number, pitch, and/or diameter of the solder bumps.

12. A method comprising:
    preparing a first calibration plot of the concentration of a solder component in a solder bump as a function of rotational speed for a wafer electroplated with a first pattern of solder bumps;
    providing a first batch of wafers to be electroplated with the first pattern of solder bumps;
    determining a first rotational speed from the first calibration plot for a predetermined concentration of the solder component; and
    electroplating the first pattern of solder bumps on the first batch of wafers in a horizontal fountain plater while rotating the first wafer at the first rotational speed, whereby the composition of the solder bumps in the first pattern is substantially constant.

13. The method according to claim 12, further comprising:
    preparing a second calibration plot of the concentration of the solder component in a solder bump as a function of rotational speed for a wafer electroplated with a second pattern of solder bumps;
    providing a second batch of wafers to be electroplated with the second pattern of solder bumps;
    determining a second rotational speed from the second calibration plot for the predetermined concentration of the solder component; and
    electroplating the second pattern of solder bumps on the second batch of wafers in the same horizontal fountain plater while rotating the second wafer at the second rotational speed.

14. The method according to claim 13, whereby the composition of the solder bumps does not vary by more than 5.0% from the first wafer to the second wafer.

15. The method according to claim 14, wherein the solder comprises silver (Ag), and the Ag concentration in the solder bumps does not vary by more than 5.0% from the first batch of wafers to the second batch of wafers.

16. The method according to claim 14, comprising electroplating the first and second batches of wafers at substantially the same plating rate and at substantially the same throughput.

17. The method according to claim 13, wherein the first and second patterns are the same or different, the method comprising rotating the first and second batches of wafers such that the solder bumps in the first pattern have a first predetermined composition and the solder bumps in the second pattern have a second predetermined composition different from the first predetermined composition.

18. The method according to claim 16, comprising rotating the first and second batches of wafers at different rotational speeds between 40 and 150 rpm.

* * * * *